(12) United States Patent
Zhou et al.

(10) Patent No.: US 6,362,669 B1
(45) Date of Patent: Mar. 26, 2002

(54) STRUCTURE AND METHOD FOR INITIALIZING IC DEVICES DURING UNSTABLE POWER-UP

(75) Inventors: Shi-dong Zhou, Milpitas; Jack Siu Cheung Lo, San Jose, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/546,897

(22) Filed: Apr. 10, 2000

(51) Int. Cl.$^7$ ................................................ H03L 7/00
(52) U.S. Cl. ...................................... 327/143; 327/198
(58) Field of Search ................................. 327/143, 198

(56) References Cited

U.S. PATENT DOCUMENTS

| | | | |
|---|---|---|---|
| 5,177,375 A | * 1/1993 | Ogawa et al. | 327/143 |
| 5,180,926 A | * 1/1993 | Skripek | 327/143 |
| 5,436,586 A | * 7/1995 | Miyamoto | 327/530 |
| 5,467,039 A | * 11/1995 | Bae | 327/198 |
| 5,767,710 A | * 6/1998 | Cho | 327/143 |
| 5,936,444 A | * 8/1999 | Pathak et al. | 327/143 |
| 6,229,352 B1 | * 5/2001 | Chevallier et al. | 327/77 |

* cited by examiner

*Primary Examiner*—Toan Tran
*Assistant Examiner*—Quan Tra
(74) *Attorney, Agent, or Firm*—Patrick T. Bever; Jeanette S. Harms, Esq

(57) ABSTRACT

A power-on reset (POR) circuit that delays de-assertion a POR control signal in an IC device such that, when unstable power levels are detected, the POR control signal is maintained in an asserted condition until the IC device is fully reset. During a start-up phase of the IC device operation, the POR control circuit maintains the POR control signal in the asserted condition for a delay period whose length is determined, in part, by the amount of noise in the applied power. After the internal voltage of the IC device achieves a steady state for a suitable period of time, the POR control circuit de-asserts the POR control signal, thereby initiating configuration of the IC device. Subsequently, if a low power condition is detected, the POR control circuit asserts the POR control signal, and maintains the POR control signal in the asserted condition for a pre-defined delay period after the low-power event is detected, thereby allowing the IC device to fully reset.

15 Claims, 3 Drawing Sheets

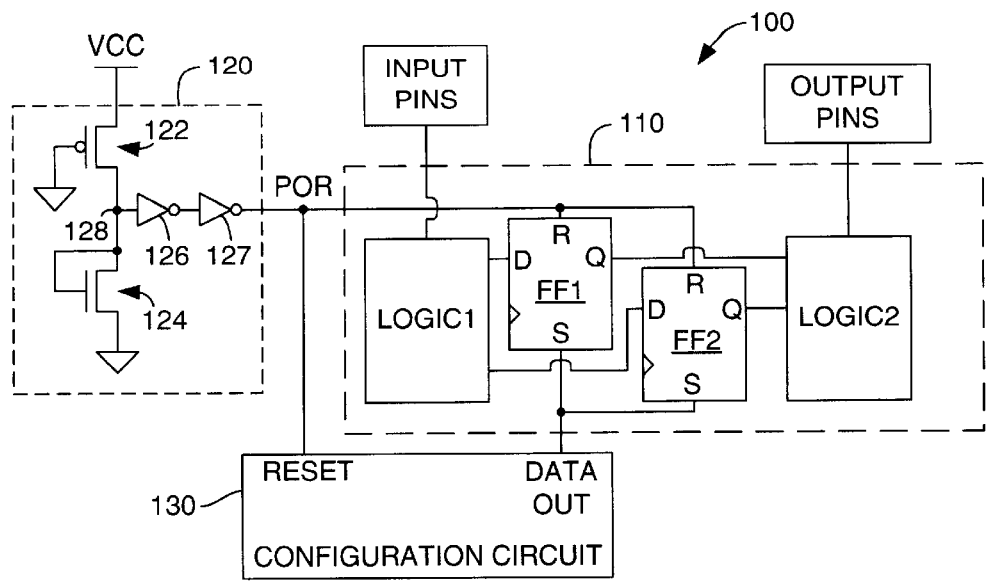
FIG. 1 (PRIOR ART)
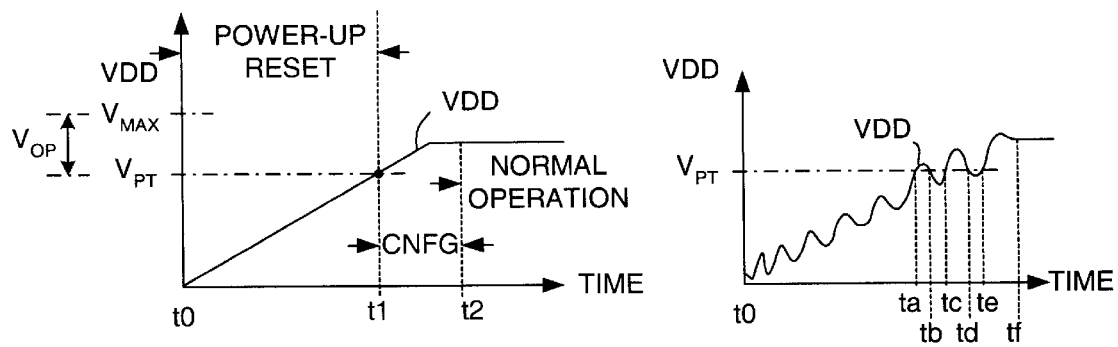
FIG. 2(A) (PRIOR ART)   FIG. 2(B) (PRIOR ART)
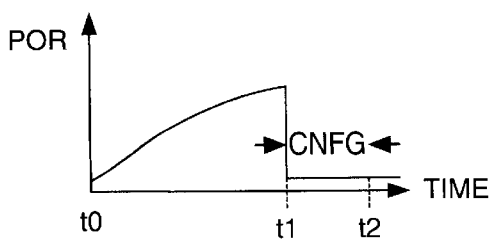   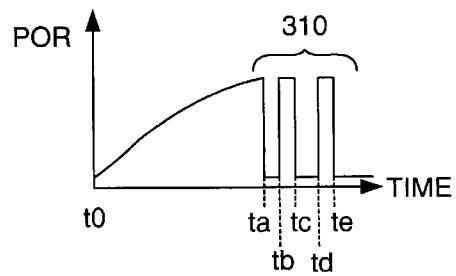
FIG. 3(A) (PRIOR ART)   FIG. 3(B) (PRIOR ART)

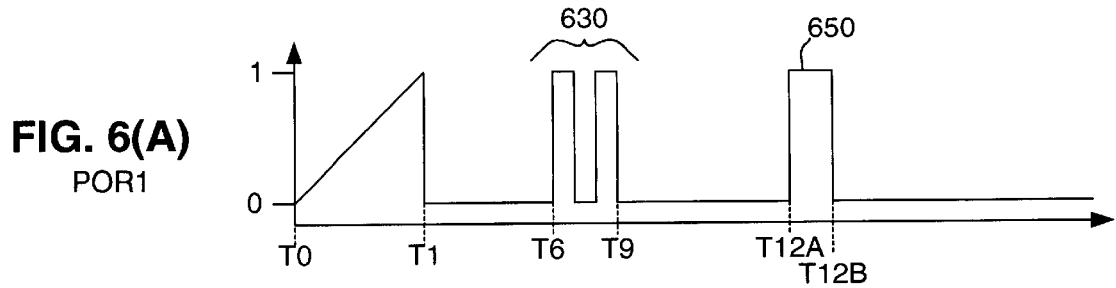
FIG. 6(A) POR1
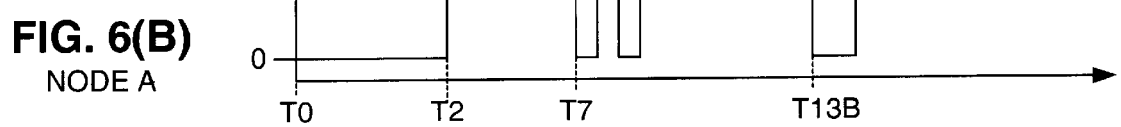
FIG. 6(B) NODE A
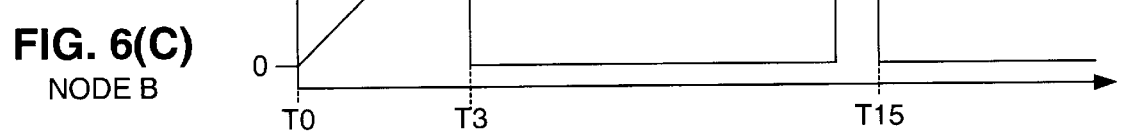
FIG. 6(C) NODE B
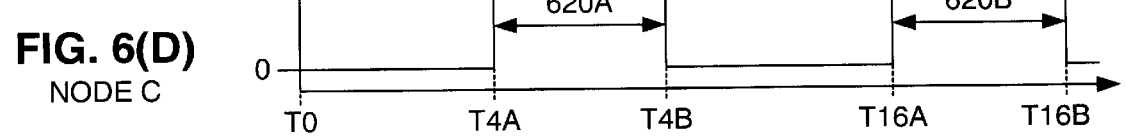
FIG. 6(D) NODE C
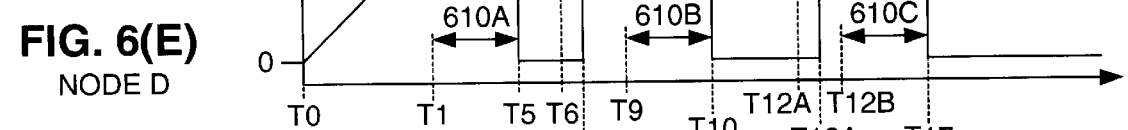
FIG. 6(E) NODE D
FIG. 6(F) POR

STRUCTURE AND METHOD FOR INITIALIZING IC DEVICES DURING UNSTABLE POWER-UP

FIELD OF THE INVENTION

The present invention relates to integrated circuits, and more particularly to power detection circuits for integrated circuits.

RELATED ART

In order to successfully initialize an integrated circuit (IC) device, the user of the IC device must supply proper power levels as specified by the device's manufacturer. Power-on reset (POR) control circuits are used in many IC devices, such as programmable logic devices (PLDs), to detect when the internal operating voltage of the IC is within this pre-defined proper power level. For example, a POR control signal generated by the POR circuit may be used to reset selected state elements (e.g., flip-flops) of the IC to a known state. In PLDs, the POR control signal is also used to initiate a configuration operation during which configuration data is written to the various programmable logic elements of the PLD.

FIG. 1 is a schematic diagram showing a simplified conventional integrated circuit (IC) 100 that includes a user logic circuit 110, a conventional power-on reset (POR) circuit 120, and a configuration circuit 130. Logic circuit 110 includes a first combinational logic portion LOGIC1, first and second flip-flops FF1 and FF2, and a second combinational logic portion LOGIC2. Combinational logic portions LOGIC1, and LOGIC2 include combinational logic circuits, such as logic gates and inverters. Flip-flops FF1 and FF2 have reset (R) terminals connected to receive the POR control signal generated by POR circuit 120, set (S) terminals connected to receive configuration data transmitted from configuration circuit 130, data input (D) terminals for receiving data transmitted from combinational logic circuit LOGIC1, and data output (Q) terminals for transmitting state information to combinational logic circuit LOGIC2. POR circuit 120 includes a p-channel transistor 122, an n-channel transistor 124, and a pair of inverters 126 and 127. The input terminal of inverter 127 is connected to a node 128, which is located between p-channel transistor 122 and n-channel transistor 124. The POR control signal is generated at the output terminal of inverter 127. The components of IC device 100 are for explanatory purposes only, and do not necessarily represent a particular IC device.

FIG. 2(A) and 3(A) are timing diagrams showing internal voltage $V_{DD}$ and the POR control signal, respectively, during an ideal power-up operation of IC device 100. Referring to FIG. 2(A), the power-up operation is divided into three parts: a power-up/reset phase (time t0 to t1), a configuration phase (time t1 to time t2), and a normal operation phase (after time t2). The power-up/reset phase begins when external power supply is initially applied to IC device 100, thereby causing internal voltage $V_{DD}$ to increase until it reaches a minimum operating voltage ("trip point") $V_{PT}$. Referring to FIG. 3(A), during the power-up/reset phase, the high POR control signal causes IC device 100 to reset. Next, referring to FIG. 3(A), when internal voltage $V_{DD}$ reaches minimum voltage $V_{PT}$ (at time t1), the POR control signal output from inverter 127 (see FIG. 1) switches to a low voltage level, thereby initiating the configuration phase. The configuration phase, which begins at time ti, involves writing configuration data into selected state elements (e.g., flip-flops FF1 and FF2; see FIG. 1). During the configuration phase, $V_{DD}$ achieves a stable operating voltage level (e.g., 5 Volts, 3.3 Volts, 2.5 Volts), which is within an operating range $V_{OP}$ that is bounded at a lower end by minimum operating voltage $V_{PT}$ and at an upper end by a maximum operating voltage $V_{MAX}$. Normal operation is initiated at a time t2, which occurs after completion of the configuration operation.

As indicated in FIG. 2(A), an ideal power-up operation is characterized by a linearly increasing internal voltage $V_{DD}$ that passes through minimum voltage $V_{PT}$ only one time (e.g., at time t1). This ideal power-up operation is difficult to achieve when internal voltage $V_{DD}$ is slow to achieve the stable state, or when noise creates power variations when the increasing $V_{DD}$ level passes through trip point $V_{PT}$.

FIGS. 2(B) and 3(B) are timing diagrams showing internal voltage $V_{DD}$ and the POR control signal, respectively, during unstable power-up operations. In particular, minor fluctuations that can occur as internal voltage $V_{DD}$ increases above minimum voltage $V_{PT}$ (e.g., at times ta through te; see FIG. 2(B)) cause rapid changes (indicated by spikes 310 in FIG. 3(B)) in the POR control signal before internal voltage $V_{DD}$ reaches the stable operating voltage (shown at time tf in FIG. 2(B)). These rapid changes in the POR control signal can cause glitches (i.e., erroneous configuration of IC device 100) that result in malfunction or improper initialization of IC device 100. Specifically, propagation of the rapidly changing POR control signal throughout IC device 100 can cause the set (configured) state and reset state of flip-flops FF1 and FF2 to become out of synchronization, thereby creating an improper configuration state (e.g., with flip-flop FF1 in a reset condition and flip-flop FF2 in a configured (set) condition) that results in erroneous operation of IC device 100.

What is needed is a POR circuit that eliminates glitches in the POR signal that are caused by unstable power-up operations.

SUMMARY

The present invention is directed to a power-on reset (POR) circuit that controls a POR control signal in an IC device such that, when unstable power levels are detected, the POR control signal is maintained in an asserted condition until the IC device is fully reset, thereby preventing glitches (i.e., erroneous configuration of the IC device) that can occur with conventional POR circuits (described above). During a start-up phase of the IC device operation, the POR control circuit maintains the POR control signal in the asserted condition for a first delay period whose length is determined, in part, by the amount of noise in the applied power signal. By maintaining the POR control signal in the asserted condition until the applied power achieves a steady state, glitches caused by rapid assertion and de-assertion of the POR control signal in response to noisy start-up conditions are prevented. After the internal voltage of the IC device achieves a steady state for a suitable period of time, the POR control circuit de-asserts the POR control signal, thereby initiating configuration of the IC device. Subsequently, if a low power condition is detected, the POR control circuit asserts the POR control signal, and maintains the POR control signal in the asserted condition for a pre-defined delay period after the low-power event is detected, thereby allowing the IC device to fully reset.

In accordance with an embodiment of the present invention, a POR circuit includes a detector circuit and a control circuit. The detection circuit generates a detection signal having a first voltage level when an internal voltage level of the IC device is less than a predefined voltage level, and a second voltage level when the internal voltage level is greater than the pre-defined voltage level. The control circuit asserts and de-asserts the POR control signal in response to changes in the detection signal. Specifically, the POR control circuit includes an one-shot delay circuit connected in parallel with a power-up delay circuit that maintain the POR control signal in an asserted state for respective delay periods after the detection signal indicates a low-power event, thereby delaying configuration until the IC device is fully reset.

The present invention will be more fully understood in view of the following description and drawings.

BRIEF DESCRIPTION OF THE DRAWINGS

FIG. 1 is a simplified schematic diagram showing an IC device including a conventional power-on reset (POR) detection circuit;

FIGS. 2(A) and 2(B) are timing diagrams showing internal voltages of the IC device of FIG. 1 during power-up;

FIGS. 3(A) and 3(B) are timing diagrams showing the generation of a POR control signal by the conventional POR control circuit of FIG. 1 during power-up;

FIGS. 6(A) through 6(F) are timing diagrams showing various signals generated by the POR control circuit of FIG. during power-up.

DETAILED DESCRIPTION

Figure 4:
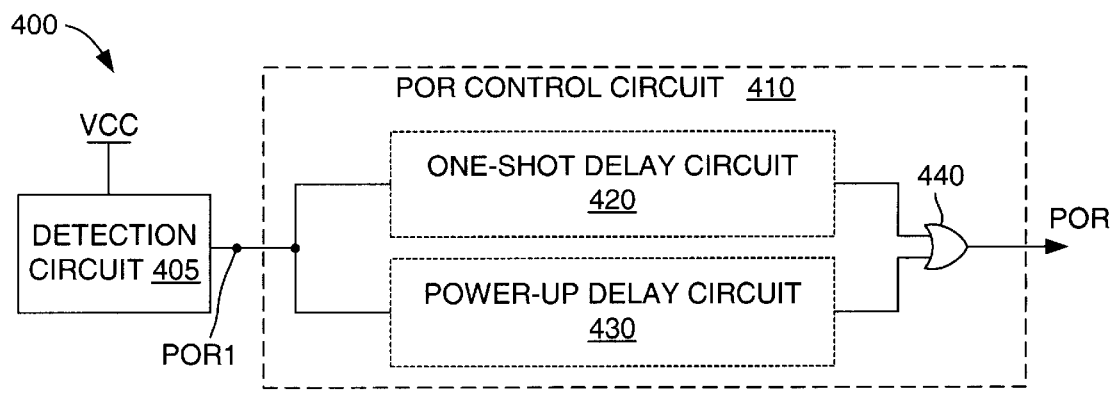
FIG. 4 is a simplified schematic diagram showing a POR control circuit according to the present invention.

FIG. 4 is a simplified schematic diagram showing a power-on reset (POR) circuit 400 in accordance with the present invention. POR circuit 400 generally includes a detection circuit 405 and a POR control circuit 410.

Similar to conventional POR circuit 120 (described above), detection circuit 405 generates a detection signal POR1 having a high (first) voltage level when an internal voltage level $V_{DD}$ of the IC device (not shown) including POR circuit 400 is less than the trip point (pre-defined voltage level) $V_{PT}$, and a low (second) voltage level when internal voltage level $V_{DD}$ is greater than trip point $V_{PT}$. However, unlike conventional POR circuit 120, the detection signal POR1 output from detector circuit 405 is passed through POR control circuit 410, which generates a POR control signal that is maintained in an asserted (high) condition until the IC device is fully reset (i.e., even if detection signal POR1 switches between high and low voltage levels), thereby preventing glitches (i.e., erroneous configuration of the IC device) that can occur with conventional IC device 100 (described above).

The POR control signal generated at the output terminal of POR control circuit 410 is used by an IC device (such as that shown in FIG. 1) in essentially the same way as in conventional IC device 100. That is, when the POR control signal is asserted (i.e., logic "1" or high), a reset operation of the IC device is initiated, and when the POR control signal is de-asserted (i.e., logic "0" or low), a configuration operation is initiated by the IC device that ends in a normal operating phase when de-asserted. Similar to conventional IC 100, logic elements of the IC device are reset to a non-configured state during the reset operation initiated by asserting the POR control signal, and the logic elements of the IC device are configured in accordance with pre-defined configuration data during the configuration operation initiated by de-asserting the POR control signal.

Referring again to FIG. 4, POR control circuit 410 generally includes a one-shot delay circuit 420 and a power-up delay circuit 430 that are connected in parallel between detection circuit 405 and an OR gate 440. The function of one-shot delay circuit 420 is to detect changes in the detection signal POR1 from the high voltage level to the low voltage level (i.e., indicating that internal voltage $V_{DD}$ is above the trip point $V_{PT}$), and to generate a one-shot pulse that maintains the POR control signal in the asserted state until the end of the one-shot pulse. In contrast, the function of power-up delay circuit 430 is to detect the high-to-low changes in the detection signal POR1, and to maintain the POR control signal in the asserted state for a pre-defined delay period. Note that when either of one-shot delay circuit 420 or power-up delay circuit 430 generate a high output signal, the POR control signal generated by OR gate 440 is asserted (high), thereby resetting the IC device incorporating POR circuit 400. As described with reference to the specific embodiment below, the combined effect of one-shot delay circuit 420 and power-up delay circuit 430 is to maintain the POR control signal in an asserted (high) condition until the IC device is fully reset, thereby preventing glitches that can occur with conventional IC device 100 (described above).

Figure 5:
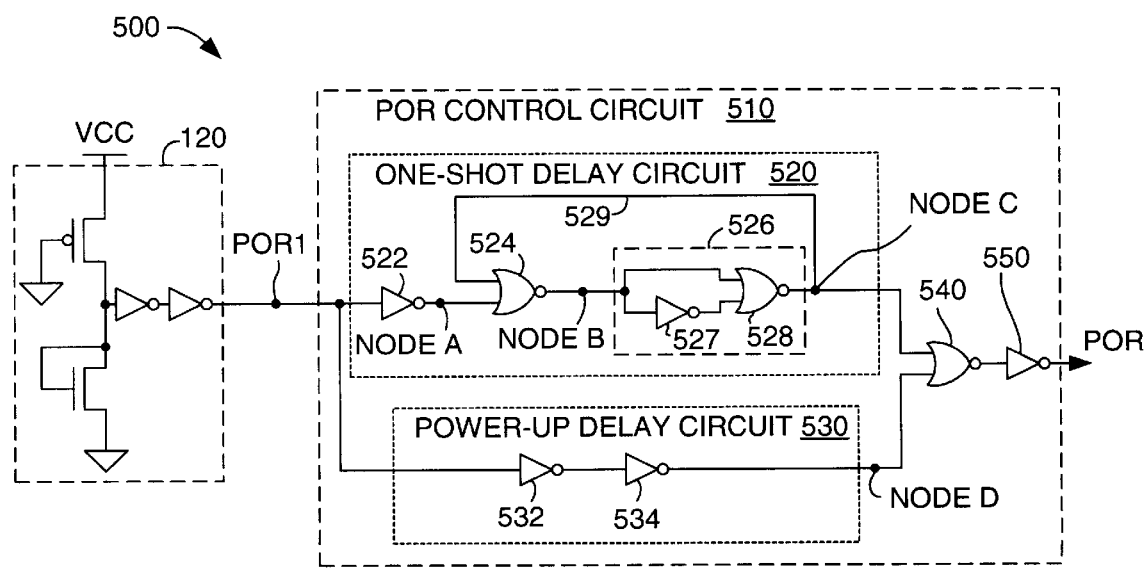
FIG. 5 is a schematic diagram showing a POR control circuit according to a specific embodiment of the present invention.

FIG. 5 is a schematic diagram illustrating a POR circuit 500 in accordance with a specific embodiment of the present invention. POR circuit 500 includes a one-shot delay circuit 520 and a power-up delay circuit 530 that are connected in parallel between a detection circuit 120 (which is identical to that described above with reference to FIG. 1) and a NOR gate 540. An inverter 550 is connected to the output terminal of NOR gate 540, and generates control signal POR.

One-shot delay circuit 520 includes a (first) inverter 522 connected to an output terminal of detector circuit 120, a lock circuit (e.g., a NOR gate) 524 having a first input terminal connected to the output terminal of inverter 522, and a one-shot circuit 526 having an input terminal connected to the output terminal of the lock circuit 524. In one embodiment, one-shot circuit 526 includes one or more series-connected inverters 527, and a NOR gate 528 having one input terminal connected to an output terminal of the last series-connected inverters 527 and a second input terminal connected to an output terminal of lock circuit 524. One-shot delay circuit also includes a feedback line 529 that is connected between an output terminal of the one-shot circuit 526.

Power-up delay circuit 530 includes two or more series-connected inverters (represented by inverters 532 and 534). In one embodiment, inverters 532 and 534 are constructed to delay the transmission of high-to-low changes of detection signal POR1 for a longer delay period than low-to-high changes. These different delay periods are achieved by constructing inverter 532 with a relatively weak P component (strong N component), and constructing inverter 534 with a relatively strong P component (weak N component) using known techniques. This construction causes inverter 532 to have a relatively low trip point and inverter 534 to have a relatively high trip point, thereby producing the necessary difference in delay periods.

The operation of POR circuit 500 will now be described with reference to FIGS. 5 and FIGS. 6(A) through 6(F), which represent timing diagrams showing signal levels of detection signal POR1 generated by detector circuit 120, control signal POR generated at the output terminal of inverter 550, and the voltage levels at nodes A, B, C, D (shown in FIG. 5).

The operation begins at time T0, when power (VCC) is applied to the IC device (not shown) including POR circuit 500. Referring to FIGS. 6(A), 6(C), 6(E), and 6(F), as internal voltage $V_{DD}$ increases, the voltage levels (logic states) of detection signal POR1, control signal POR, and nodes B and D all increase to logic "1". As indicated in FIGS. 6(B) and 6(D), nodes A and C of POR circuit 500 remain low (i.e., logic "0" ) as $V_{DD}$ increases.

At time T1, internal voltage $V_{DD}$ reaches trip point $V_{PT}$. Referring to FIG. 6(A), as internal voltage $V_{DD}$ rises above trip point $V_{PT}$, detection signal POR1 switches from high to low (i.e., from logic "1" to logic "0") for reasons similar to those provided above regarding the generation of control signal POR by conventional POR circuit 120 (see FIGS. 1 and 2(A), described above). In addition, referring to FIG. 6(E), a delay reset period 610A begins as the low POR1 signal propagates through power-up delay circuit 530 (note that node D remains high during delay period 610A). Referring to FIG. 6(F), control signal POR remains high due to the logic "1" signal at node D (which forces NOR gate 540 to generate a low output signal, which in turn causes inverter 550 to generate a high control signal POR). That is, power-up delay circuit 530 maintains control signal POR in an asserted state after internal voltage $V_{DD}$ increases above trip point $V_{PT}$ during power-up, thereby avoiding glitches that can be caused when $V_{DD}$ fluctuates about trip point $V_{PT}$ (see FIG. 2(B)).

Referring to FIG. 6(B), at time T2 (i.e., after the low POR1 signal passes through inverter 522; see FIG. 5), node A shifts high (to logic "1"), thereby applying a high voltage signal to the lower input terminal of lock circuit 524 (see FIG. 5). Referring to FIG. 6(F), control signal POR remains high at time T2 due to delay reset period 610A (i.e., the logic "1" signal is maintained at node D).

Referring to FIG. 6(C), at time T3, after a delay caused by lock circuit 524, node B shifts high (logic "1"), thereby applying a high signal to one-shot circuit 526. Again, control signal POR remains high due to delay reset period 610A (i.e., the logic "1" signal generated at node D).

Referring to FIG. 6(D), after a short delay caused by NOR gate 528 of one-shot circuit 526, node C is driven high (time T4A). Note that the high signal is fed back to lock circuit 524, thereby locking the high output signal generated by one-shot circuit 526 for a one-shot delay period 620A. As discussed above, the length of one-shot delay period 620A is determined by the construction of one-shot circuit 526 (e.g., the number of series-connected inverters 527). Referring to FIG. 6(F), control signal POR remains high due to delay reset period 610A, during which a high signal is generated at node D, and also due to one-shot delay period 620A, during which a high signal is generated at node C. Note that either of the high signals applied to the input terminals of NOR gate 540 would maintain the POR control signal in the asserted state.

Referring to FIG. 6(E), time T5 marks the end of delay reset period 610A, thereby causing node D to shift low. Note that control signal POR remains high (FIG. 6(F)) at time T5 due to one-shot delay period 620A (i.e., the high signal at node C).

Subsequently, at time T6, in accordance with the present example, power supply noise is introduced that causes $V_{DD}$ to drop below trip point $V_{PT}$. This $V_{DD}$ drop is indicated as logic "1" spikes 630 in detection signal POR1, shown in FIG. 6(A). Referring to FIG. 6(E), a delay period 640A begins at time T6, whose length is determined by the construction of power-up delay circuit 530. Referring to FIG. 6(F), even though node D remains low as the high detection signal POR1 propagates through power-up delay circuit 530, control signal POR remains high due to one-shot delay period 620A (see FIG. 6(D)). Accordingly, glitches caused by noise (indicated by spikes 630) that are generated during the power-up/reset phase of an IC's operation are avoided by POR circuit 500.

Referring to FIG. 6(B), node A shifts low at time T7 (i.e., after a short delay caused by the propagation of spikes 630 through inverter 522). As shown in FIG. 6(C), the low voltage at node A is not passed by lock circuit 522 due to the high feedback signal from node C. Accordingly, node B remains low in response to spikes 630 that are generated during one-shot delay period 620A. As shown in FIG. 6(F), control signal POR remains high due to one-shot delay period 620A, which maintains a high (logic "1") signal at node C.

Referring to FIG. 6(E), at time T8 (which may or may not exactly correspond to time T7), short delay period 640B ends (i.e., the first high spike 630 propagates through power-up delay circuit 530), thereby causing the level at node D to shift to logic "1". Note that control signal POR remains high (FIG. 6(F)) at time T8 due to one-shot delay period 620A (i.e., the high signal at node C), and the high signal at node D.

Referring to FIG. 6(A), the high-to-low transition of detection signal POR1 marking the end of spikes 630 is indicated at time T9. Referring now to FIG. 6(E), time T9 also tolls the beginning of delay reset period 610B, which maintains node D at a high voltage level until the high-to-low transition of detection signal POR1 propagates through delay circuit 530.

Referring to FIG. 6(D), the end of one-shot delay period 620A, which in the present example occurs at time T4B, causes the signal at node C to shift low. However, according to the present example, because node D remains high (due to delay reset period 610B; see FIG. 6(E)), control signal POR remains in the asserted state, as shown in FIG. 6(F).

Referring to FIG. 6(E), delay reset period 610B ends at time T10, thereby forcing node D low. Subsequently, as shown in FIG. 6(F), at time T11 (i.e., after a delay through NOR gate 540 and inverter 550), because the signals at both nodes C and D are low, control signal POR shifts low (i.e., enters a de-asserted state), thereby initiating a configuration operation of the IC device incorporating POR circuit 500.

As set forth in the above example, the assertion of control signal POR is delayed by POR control circuit 510 throughout the power-up reset phase covering time period T0 through T11, thereby preventing glitches that can be caused, for example, by spikes 630 occurring after internal voltage $V_{DD}$ reaches trip point $V_{PT}$. Accordingly, instead of attempting to change detection circuit 120, the present invention addresses this glitching problem not by modifying the detection signal POR1 generated by detection circuit 120 using POR control circuit 510.

Further, as indicated by spike 650 in FIG. 6(A), if the IC device including POR circuit 500 subsequently experiences a low-power event, POR circuit 500 reliably delays reconfiguration of the IC device until it has time to fully reset. That is, if $V_{DD}$ drops below trip point $V_{PT}$ at time T12A, the resulting spike 650 in detection signal POR1 causes both one-shot delay circuit 510 and power-up delay circuit 530 to generate high output signals that re-assert control signal POR. Specifically, spike 650 causes power-up delay circuit 520 to generate a high node D signal at time T13A (i.e., after a short delay through power-up delay circuit 520), which is then propagated through NOR gate 540 and inverter 550 to de-assert control signal POR at time T14 (see FIGS. 6(E) and 6(F)). Note that node D is maintained at this high voltage level for a delay reset period 610C, which begins at time T12B (i.e., on the falling edge of spike 650; see FIG. 6(A)). Spike 650 also propagates through inverter 522 to node A at time T13B (i.e., after a delay caused by inverter 522; see FIGS. 5 and 6(B)), through lock circuit 524 to produce a high node B signal at time T15, and, finally, to one-shot circuit 526, which generates a high node C signal at time T16A. One shot-delay circuit 520 maintains the high node C signal throughout a delay period 620B, which has the same length as delay period 620A (discussed above). Subsequently, at time T17 (FIG. 6(E)), delay reset period 610C ends, thereby causing node D to switch to a low voltage level, followed by the end of delay period 620B at time T16B (FIG. 6(D)). With low signals at both nodes C and node D, control signal POR is subsequently de-asserted at time T18 (see FIG. 6(F)), thereby reinitiating configuration of the IC device. Accordingly, by constructing POR control circuit 510 to produce suitable delay periods 610C and 620B, POR circuit 500 reliably delays reconfiguration of the IC device after a low-power event until the IC device is fully reset, thereby avoiding the glitches associated with conventional POR circuits.

As suggested above, in addition to the specific embodiments disclosed herein, other modifications are also possible that fall within the spirit and scope of the present invention. Therefore, the invention is limited only by the following claims.

What is claimed is:

1. A power-on reset (POR) circuit for generating a POR control signal in an integrated circuit (IC) device, wherein assertion of the POR control signal initiates a reset operation in which logic elements of the IC device are reset to a non-configured state, and de-assertion of the POR control signal initiates a configuration operation in which logic elements of the IC device are configured in accordance with pre-defined configuration data, the POR circuit comprising:

a detector circuit for generating a detection signal having a first voltage level when an internal voltage level of the IC device is less than a pre-defined voltage level, and a second voltage level when the internal voltage level is greater than the pre-defined voltage level; and a POR control circuit including a one-shot delay circuit for detecting a change in the detection signal from the first voltage level to the second voltage level, and for maintaining the POR control signal in an asserted state by generating a one-shot pulse in response to the detection signal change such that the POR signal is maintained in the asserted state at least until the end of the one-shot pulse, the one-shot delay circuit including:
      a first inverter connected to the detector circuit;
      a lock circuit having a first input terminal connected to an output terminal of the first inverter; and
      a one-shot circuit having an input terminal connected to an output terminal of the lock circuit,
      wherein the lock circuit also has a second input terminal connected to an output terminal of the one-shot circuit.

2. The POR circuit according to claim 1, wherein the lock circuit comprises a NOR gate.

3. The POR circuit according to claim 1, wherein the one-shot circuit comprises:
   a second inverter having an input terminal connected to the output terminal of the lock circuit; and
   a NOR gate having a first input terminal connected to the output terminal of the lock circuit, and a second input terminal connected to receive an inverted signal generated by the second inverter.

4. The POR circuit according to claim 1, wherein the POR control circuit further comprises a NOR gate having a first input terminal connected to an output terminal of the one-shot circuit, and an inverter having an input terminal connected to an output terminal of the NOR gate, wherein the POR control signal is generated at an output terminal of the inverter.

5. The POR circuit according to claim 4, further comprising a power-up delay circuit having an input terminal connected to the output terminal of the detection circuit, and an output terminal connected to a second input terminal of the NOR gate.

6. The POR circuit according to claim 5, wherein the delay circuit comprises a first inverter connected in series with a second inverter, wherein the first and second inverters are constructed such that the first inverter has a trip point that is higher than that of the second inverter.

7. A power-on reset (POR) circuit for generating a POR control signal in an integrated circuit (IC) device, wherein assertion of the POR control signal initiates a reset operation in which logic elements of the IC device are reset to a non-configured state, and de-assertion of the POR control signal initiates a configuration operation in which logic elements of the IC device are configured in accordance with pre-defined configuration data, the POR circuit comprising:

a detector circuit for generating a detection signal having a first voltage level when an internal voltage level of the IC device is less than a pre-defined voltage level, and a second voltage level when the internal voltage level is greater than the pre-defined voltage level;

a POR control circuit including:
      a power-up delay circuit for detecting a change in the detection signal from the first voltage level to the second voltage level, and for maintaining the POR circuit in an asserted state for a pre-defined first delay period after the detection signal changes from the first voltage level to the second voltage level, and
      a one-shot delay circuit for detecting a change in the detection signal from the first voltage level to the second voltage level, and for maintaining the POR control signal in an asserted state by generating a one-shot pulse in response to the detection signal change such that the POR signal is maintained in the asserted state at least until the end of the one-shot pulse.

8. The POR circuit according to claim 7, wherein the power-up delay circuit comprises a first inverter connected in series with a second inverter, and wherein the first inverter and second inverter are constructed such that the first inverter has a trip point that is higher than that of the second inverter.

9. The POR circuit according to claim 7, wherein the power-up delay circuit comprises means for changing the POR circuit from a de-asserted state to an asserted state a pre-defined second delay period after the detection signal changes from the second voltage level to the first voltage level, wherein the pre-defined second delay period is less than the pre-defined first delay period.

10. A method for initializing an IC device during unstable power-up by generating a power-on reset (POR) control signal, wherein assertion of the POR control signal initiates a reset operation in which logic elements of the IC device are reset to a non-configured state, and de-assertion of the POR control signal initiates a configuration operation in which logic elements of the IC device are configured in accordance with pre-defined configuration data, the method comprising:

generating a detection signal having a first voltage level when an internal voltage level of the IC device is less than a pre-defined voltage level, and a second voltage level when the internal voltage level is greater than the pre-defined voltage level;

detecting a change in the detection signal from the first voltage level to the second voltage level;

maintaining the POR control signal in an asserted state during a first delay period that begins after the detection signal changes from the first voltage level to the second voltage level;

maintaining the POR control signal in the asserted state by generating a one-shot pulse in response to the detection signal change such that the POR signal is maintained in the asserted state at least until the end of the one-shot pulse; and de-asserting the POR control signal at an end of the longer of the first delay period and the end of the one-shot pulse.

11. The method according to claim 10, wherein maintaining the POR control signal in the asserted state comprises transmitting the detection signal through a delay circuit.

12. The method according to claim 11, further comprising:

after de-asserting the POR control signal, detecting a change in the detection signal from the second voltage level to the first voltage level;

re-asserting the POR control signal after the detection signal changes from the first voltage level to the second voltage level; and maintaining the POR control signal in the asserted state during a second delay period that begins after the detection signal changes back from the first voltage level to the second voltage level.

13. The method according to claim 12, wherein re-asserting the POR circuit comprises transmitting the detection signal through a delay circuit.

14. The method according to claim 11, further comprising:

after de-asserting the POR control signal, detecting a change in the detection signal from the second voltage level to the first voltage level;

re-asserting the POR control signal after the detection signal changes from the second voltage level to the first voltage level; and maintaining the POR control signal in the asserted state during a second delay period that begins after the detection signal changes from the second voltage level to the first voltage level.

15. The method according to claim 12, wherein re-asserting the POR circuit comprises transmitting the detection signal through a one-shot circuit.

* * * * *